United States Patent
Haluzak et al.

(10) Patent No.: US 7,723,811 B2
(45) Date of Patent: May 25, 2010

(54) PACKAGED MEMS DEVICE ASSEMBLY

(75) Inventors: Charles C Haluzak, Corvallis, OR (US); Jeffrey R Pollard, Corvallis, OR (US); Kirby Sand, Corvallis, OR (US); John R Sterner, Corvallis, OR (US); Henry Kang, Corvallis, OR (US); Chien-Hua Chen, Corvallis, OR (US); James Denning Smith, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 822 days.

(21) Appl. No.: 11/416,709

(22) Filed: May 3, 2006

(65) Prior Publication Data

US 2008/0272446 A1 Nov. 6, 2008

(51) Int. Cl.
*H01L 29/82* (2006.01)
(52) U.S. Cl. .................. 257/415; 257/680; 257/682
(58) Field of Classification Search .................. 257/415, 257/680, 682
See application file for complete search history.

(56) References Cited

U.S. PATENT DOCUMENTS

| | | | |
|---|---|---|---|
| 7,087,134 B2 | 8/2006 | Chen et al. | |
| 2006/0163711 A1* | 7/2006 | Roels | 257/680 |
| 2006/0208326 A1* | 9/2006 | Nasiri et al. | 257/414 |
| 2008/0283990 A1* | 11/2008 | Nasiri et al. | 257/684 |

OTHER PUBLICATIONS

C. Rusu et al., Self-aligned 0-level sealing of MEMS devices by a two layer thin film reflow process, Microsystem Technologies, vol. 10, No. 5, pp. 364-371 (2004).
C. Rusu et al., MEMS 0-level packaging using thin-film poly-SiGe caps, Procs. of IMAPS ATW on Packaging of MEMS and Related Micro Integrated Nano Systems, Sep. 6-8, 2002.
SUMICAP, Surface Micromachined Encapsulation on Wafer Level, project under IST of EC contract number IST-1999-10620, Jan. 2000-Dec. 2002.
A. Hochst et al., Stable thin film encapsulation of accleration sensors using polycrystalline silicon . . . , Sensors and Actuators Journal, vol. 114, Issue 2-3, Sep. 2004.
H. Stahl et al., Thin film encapsulation of acceleration sensors . . . , Procs. of Transducers, 12th Int'l Conf. on Solid-State Sensors, Actuators & Microsys., Jun. 8-12, 2003.

* cited by examiner

*Primary Examiner*—Long Pham (57) ABSTRACT

A packaged micro-electromechanical systems (MEMS) device assembly includes a MEMS device, a substrate within which the MEMS device is disposed, and a lid disposed over the substrate. The assembly may include one or more first cavities within the lid having a predetermined volume satisfying packaging specifications for the packaged MEMS device assembly. The assembly may include one or more second cavities within the lid and one or more corresponding overflow areas within the lid, where each second cavity contains a material and each corresponding overflow area is adapted to catch overflow of the material. The assembly may include one or more third cavities within the lid and one or more channels within one of the substrate and the lid to fluidically connect the MEMS device to the third cavities.

11 Claims, 9 Drawing Sheets

PACKAGED MEMS DEVICE ASSEMBLY

BACKGROUND

Display devices are commonly used for computing device purposes, as well as for large-scale viewing purposes, such as business presentations and home theaters. One type of display device uses a micro-electromechanical systems (MEMS) device, such as a digital-mirror device (DMD), an interference-type MEMS device, or another type of MEMS device. Light is output incident to the MEMS device. The MEMS device reflects or otherwise manipulates the light differently based on the desired image to be displayed. The light after manipulation by the MEMS device may be output externally from the display device of which the MEMS device is a part, for viewing purposes.

While the MEMS device can itself be an expensive component of a display device, the packaging of the MEMS device also can contribute to the expense of display device. That is, to employ a MEMS device within a display device, the MEMS device has to be packaged into a packaged MEMS device assembly. The manner by which the MEMS device is packaged into this assembly can significantly contribute to how expensive the display device is, and thus contribute to the commercial success of the display device.

DETAILED DESCRIPTION OF THE DRAWINGS

Packaged MEMS Device Assembly

Figure 1A:
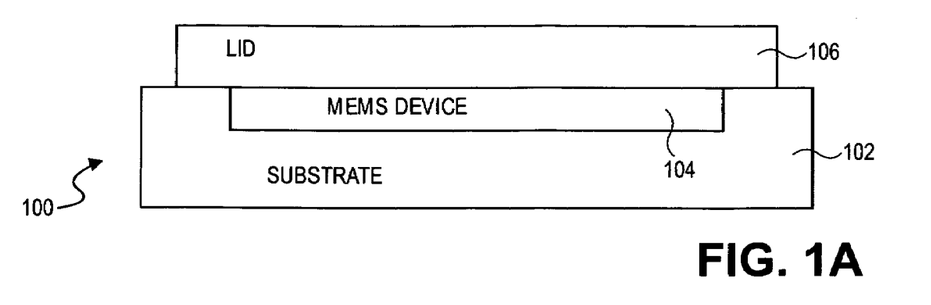
FIGS. 1A and 1B are diagrams of a packaged micro-electromechanical systems (MEMS) device assembly, according to different embodiments of the invention.
Figure 1B:
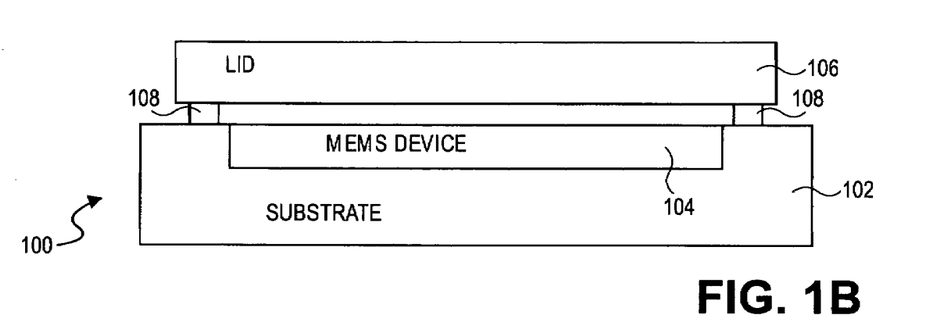

FIGS. 1A and 1B show a packaged micro-electromechanical systems (MEMS) device assembly 100, according to varying embodiments of the invention. The packaged MEMS device assembly 100 includes a substrate 102, such as a silicon substrate. A MEMS device 104 is disposed within the substrate 102. A lid 106, such as a glass or a silicon lid, or another type of material, is disposed over the MEMS device 104 and the substrate 102. The lid 106 may be substantially transparent in one embodiment. As can be appreciated by those of ordinary skill within the art, the packaged MEMS device assembly 100 can and typically will have other components in addition to those depicted in FIGS. 1A and 1B, some of which are particularly shown and described later in the detailed description.

The MEMS device 104 may include a number of display elements for a display device, such that the packaged MEMS device assembly 100 is part of a display device. Each of these display elements, or small groupings of these display elements, may correspond to a pixel of the display device. Such a MEMS device may be a digital micromirror device (DMD), an interference-type MEMS device, or another type of MEMS device. Furthermore, the MEMS device 104 may be a non-optical and/or a non-display type of MEMS device as well, in which case the lid 106 may not be substantially transparent.

In FIG. 1A, the lid 106 is in direct bonding contact with the substrate 102 within which the MEMS device 104 is disposed. For instance, the lid 106 may be bonded to the substrate 102 and the MEMS device 104 by plasma-activated bonding. By comparison, in FIG. 1B, the lid 106 is in bonding contact with a ring 108 that has itself been attached to the substrate 102. Thus, in FIG. 1B, the lid 106 is not in direct contact with the substrate 102. The bond between the ring and the lid 106 may be a solder bond, an anodic bond, a plasma-activated bond, or another type of bond.

In both FIGS. 1A and 1B, a hermetic seal is defined between the lid 106 and the substrate 102. In FIG. 1A, the hermetic seal is defined at the interface where the lid 106 and the substrate 102 make direct bonding contact. In FIG. 1B, the hermetic seal is defined at the interface between the ring 108 and the lid 106, and at the interface between the ring 108 and the substrate 102.

Figure 1C:
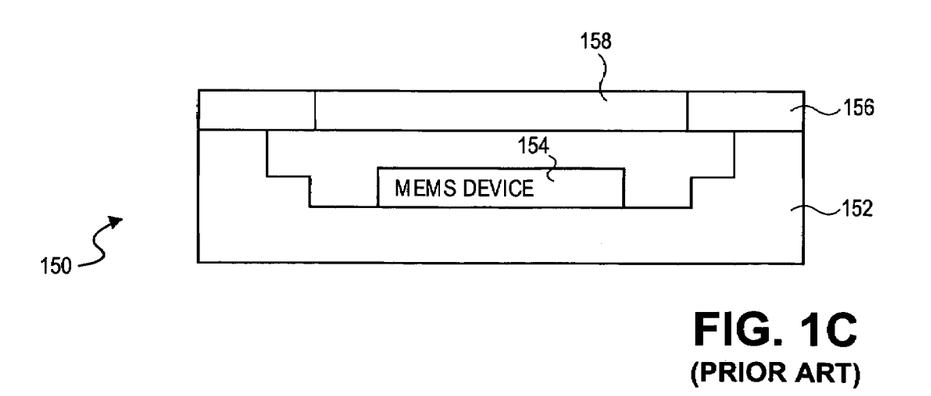
FIG. 1C is a diagram of a packaged MEMS device assembly, according to the prior art.

The packaged MEMS device assembly 100 of FIG. 1A or FIG. 1B is intrinsically a simpler, and thus less expensive, packaging of the MEMS device 104 than is provided within the prior art. For instance, FIG. 1C shows a prior art packaged MEMS device assembly 150. Within a bottom portion 152, the MEMS device 154 is disposed. A top portion 156 includes a transparent window 158.

The complexity of the packaged MEMS device assembly 150 results from at least a number of factors. First, the bottom portion 152 of the assembly 150 has a relatively complex shape, with a bottom step within which the MEMS device 154 resides. Second, the top portion 156 of the assembly 150 is also relatively complex, since the window 158 has to be disposed therein. The packaged MEMS device assembly 150 is thus a more complex and more expensive assembly than the packaged MEMS device assembly 100 of the embodiment of FIG. 1A or of the embodiment of FIG. 1B.

Various cavities, channels, and other features of the packaged MEMS device assembly 100, that enable or promote the packaged MEMS device assembly 100 to function properly, are now described. While some of these features are shown and described in relation to the packaged MEMS device assembly of FIG. 1A, they are also applicable to the packaged MEMS device assembly of FIG. 1B. Likewise, while other of these features are shown and described in relation to the packaged MEMS device assembly of FIG. 1B, they are also applicable to the packaged MEMS device assembly of FIG. 1A. Furthermore, whereas discrete embodiments of the packaged MEMS device assembly are shown and described in separate detail, these different embodiments may be combined within the same packaged MEMS device assembly.

Figure 2:
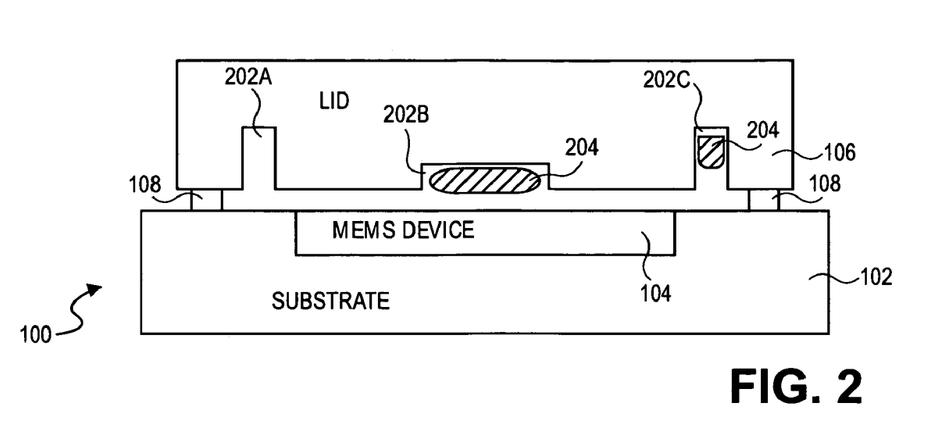
FIG. 2 is a diagram of a packaged MEMS device assembly having a number of cavities that can remain empty or that can have material disposed therein, and which increase the internal air volume of the assembly, according to an embodiment of the invention.

FIG. 2 shows the packaged MEMS device assembly 100 in more detail, according to an embodiment of the invention. The MEMS device assembly 100 of FIG. 2 is specifically a more detailed version of the assembly 100 of FIG. 1B. Thus, the substrate 102 includes the MEMS device 104 disposed therein, and the lid 106 is disposed over the substrate 102 via the ring 108. The MEMS device assembly 100 includes a number of cavities 202A, 202B, and 202C, collectively referred to as the cavities 202. While there are three such cavities 202 in the example of FIG. 2, there may be more or less of the cavities 202 in other embodiments.

The cavities 202 provide the packaged MEMS device assembly 100 with a predetermined internal air volume that satisfies packaging specifications for the assembly 100. For example, it is apparent from comparing the prior art packaged MEMS device assembly 150 of FIG. 1C with the packaged MEMS device assembly 100 of FIG. 1A or FIG. 1B that the assembly 150 has greater interior air volume around the MEMS device 154 than the assembly 100 has around the MEMS device 104. The packaging specifications for a packaged MEMS device assembly may require that the internal air volume around the MEMS device 104 to be sufficiently high.

First, for instance, leak testing of the packaged MEMS device assembly 100 may need a predetermined amount of internal air volume to ensure that the MEMS device 104 is hermetically sealed within the assembly 100. If there is insufficient air volume, then the testing tools employed to determine if there is an air leak of the assembly 100 may not be able to detect the leak. That is, such testing tools may just be able to detect a predetermined minimum amount of leakage that is greater than the amount of gas trapped within the assembly 100. Therefore, by increasing the internal gas volume within the assembly 100, via the cavities 202, the amount of gas trapped within the assembly 100 is greater, such that the testing tools are able to determine if this gas is leaking from the packaged MEMS device assembly 100. The gas may be helium, krypton, or another gas.

Second, as another example, increasing the internal air volume around the MEMS device 104 may be advantageous to ensure that water vapor does not condense on the MEMS device 104 itself. Where the internal air volume is at a minimum, there is a greater likelihood that such condensation will occur on the MEMS device 104. By increasing the internal air volume, via the cavities 202, the likelihood that condensation will occur on the MEMS device 104 is decreased.

Third, increasing the air volume around the MEMS device 104 may be advantageous in that it decreases the effect of contaminants entering the packaged MEMS device assembly 100. For instance, if a small amount of contaminant enters the assembly 100, it will become diffused over a larger volume of air. As a result, less contamination occurs due to a given amount of contaminant entering the assembly 100.

Fourth, increasing the air volume around the MEMS device 104 may be advantageous to ensure that an internal package pressure specification is maintained over a specified lifetime of the packaged MEMS device assembly 100, given a maximum allowable leakage rate. That is, desirably the substrate 102 is hermetically sealed to the lid 106. In actuality, specifications provide for a small leakage rate. By increasing the air volume around the MEMS device 104, such a small leakage rate can be sustained over the specified lifetime of the assembly 100, while still maintaining the desired internal package pressure of the MEMS device assembly 100.

The cavities 202 may remain empty, or the same or different material 204 may be disposed within the cavities 202. In the example of FIG. 2, for instance, the cavity 202A remains empty, while the cavities 202B and 202C have a material 204 disposed within. The type of material disposed within each of these cavities 202B and 202C may be the same or different. Examples of different types of materials that may be disposed within the cavities 202 include desiccant materials, which are hydrophilic and thus attract water and water vapor, as well as other types of getter materials, which attract nitrogen, oxygen, and/or other chemicals other than water. Furthermore, lubricants may be disposed within the cavities 202, which may be desired to prevent or at least minimize stiction and/or friction.

Figure 3:
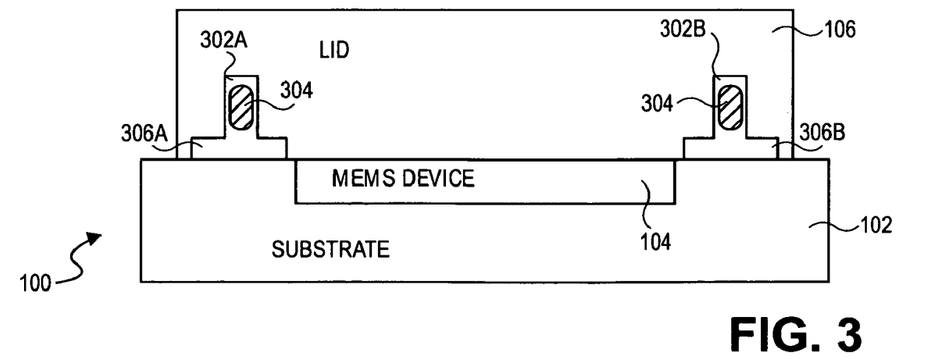
FIG. 3 is a diagram of a packaged MEMS device assembly having a number of cavities and corresponding overflow areas that are adapted to catch overflow of material disposed within the cavities, according to an embodiment of the invention.

FIG. 3 shows the packaged MEMS device assembly 100 in more detail, according to another embodiment of the invention. The MEMS device assembly 100 of FIG. 3 is specifically a more detailed version of the assembly 100 of FIG. 1A. Thus, the substrate 102 includes the MEMS device 104 disposed therein, and the lid 106 is disposed in direct bonding contact with the substrate 102 within which the MEMS device 104 is disposed. The MEMS device assembly 100 includes a number of cavities 302A and 302B, collectively referred to as the cavities 302. While there are two such cavities 302 in the example of FIG. 3, there may be more or less of the cavities 302 in other embodiments. The cavities 302 of FIG. 3 may be the same or different cavities as the cavities 202 of FIG. 2.

The cavities 302 include conjoining and corresponding overflow areas 306A and 306B, collectively referred to as the overflow areas 306. In particular, each of the cavities 302 is said to be overlapped by a corresponding one of the overflow areas 306, as is particularly shown in FIG. 3 via the cavities 302 and the overflow areas 306 being centered relative to one another. The overflow area for a given cavity has a width greater than the width of the cavity itself, but the depth of the overflow area from the bottom of the lid 106 is shallower than the depth of the cavity itself from the bottom of the lid 106, as is also particularly shown in FIG. 3.

The overflow areas 306 ensure that when the material 304 is added to or disposed within the cavities 302, that any spillage or overflow is contained or caught by the overflow areas 306. (As with the cavities 202 of FIG. 2, the material 304 within the cavities 302 may be the same or different type of material, such as a desiccant, another type of getter material, a lubricant, or another type of material.) That is, before mating of the lid 106 to the substrate 102 to bond the former to the latter, the lid 106 is oriented upside-down as compared to its orientation in FIG. 3. At this time, the material 304 is added to the cavities 302. The nature of the adding or disposition process of the material 304 relative to the cavities 302 is such that the material 304 may be in liquid form, and may be disposed through a tube, via a wick, and so on.

When placing the material 304 into the cavities 302, there can be a likelihood that a little too much of the material 304 is added to the cavities 302. Without the corresponding overflow areas 306, which may also be referred to as reservoirs, the likelihood is that such overflow or spillage of the material 304 will overflow or spill onto the surface of the lid 106, which is the bottom surface of the lid 106 as depicted in FIG. 3. Therefore, the bond between the lid 106 and the substrate 102 is likely to be adversely affected, due to the presence of the extraneous material 304, and reducing the quality of the packaged MEMS device assembly 100 as a whole.

Therefore, presence of the overflow areas 306 contains or catches any such overflow or spillage of the material 304 when the material 304 is added to the cavities 302. As such, there is reduced likelihood that such overflow or spillage of the material 304 will overflow or spill onto the surface of the lid 106. Therefore, the bonding between the lid 106 and the substrate 102 is unlikely to be adversely affected by the presence of such extraneous material 304, improving the quality of the packaged MEMS device assembly 100 as a whole. Thus, the overflow areas 306 are adapted to catch overflow of the material 304 added to the cavities 302 to which they correspond.

Figure 4:
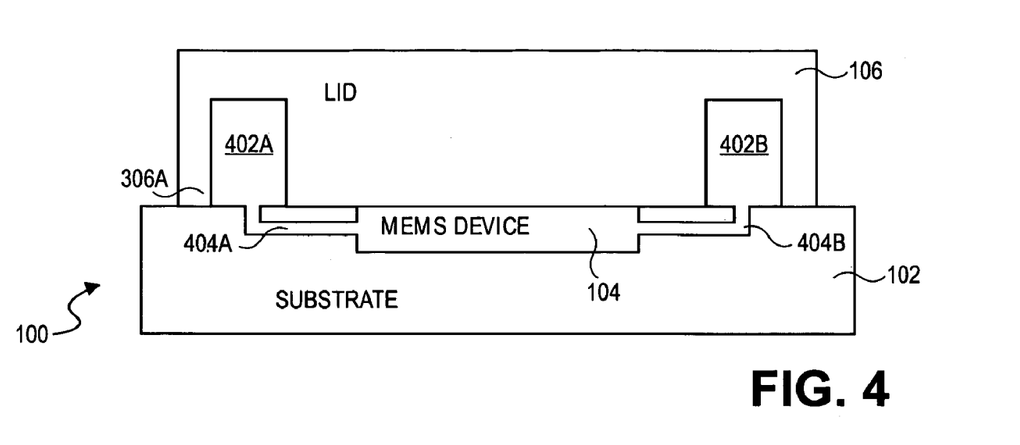
FIG. 4 is a diagram of a packaged MEMS device assembly having a number of cavities and a number of channels fluidically connecting the MEMS device of the assembly to the cavities, according to an embodiment of the invention.
Figure 5A:
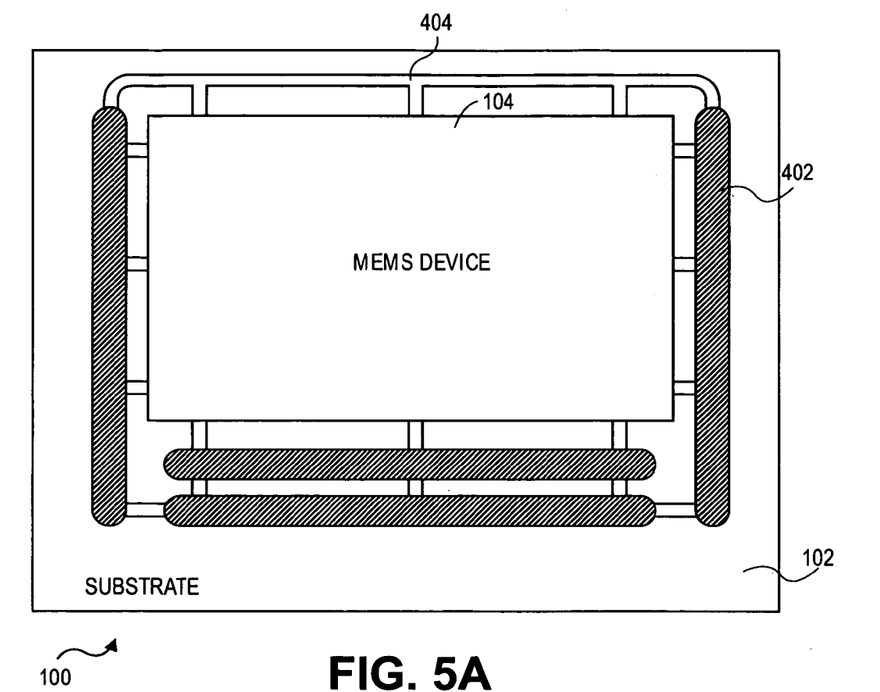
FIGS. 5A, 5B, 5C, and 5D are cross-sectional top-view diagrams of a packaged MEMS device assembly having a number of cavities and a number of channels fluidically connecting the MEMS device of the assembly to the cavities, according to varying embodiments of the invention.
Figure 5B:
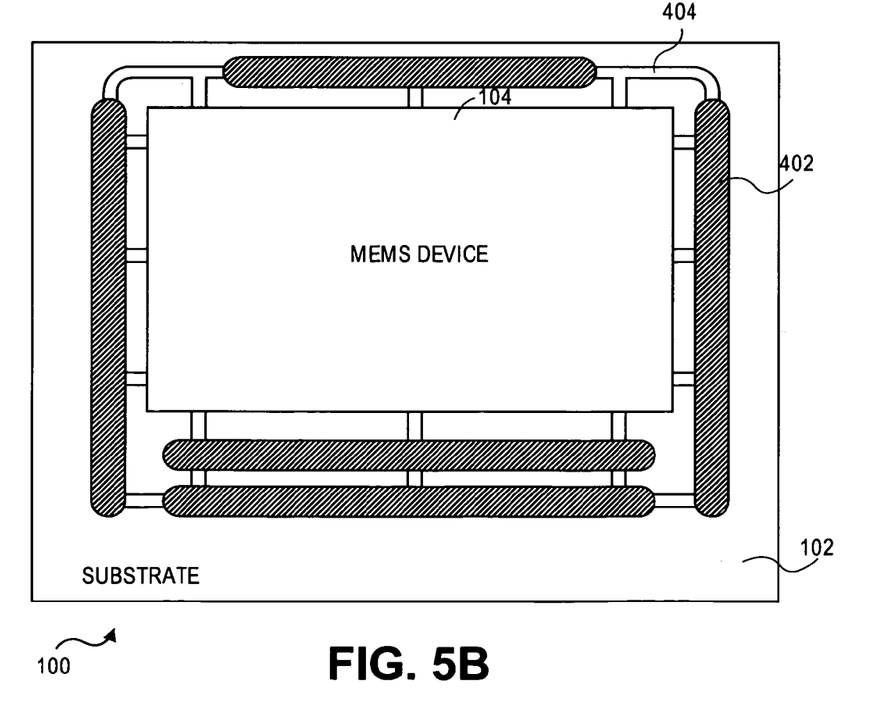
Figure 5C:
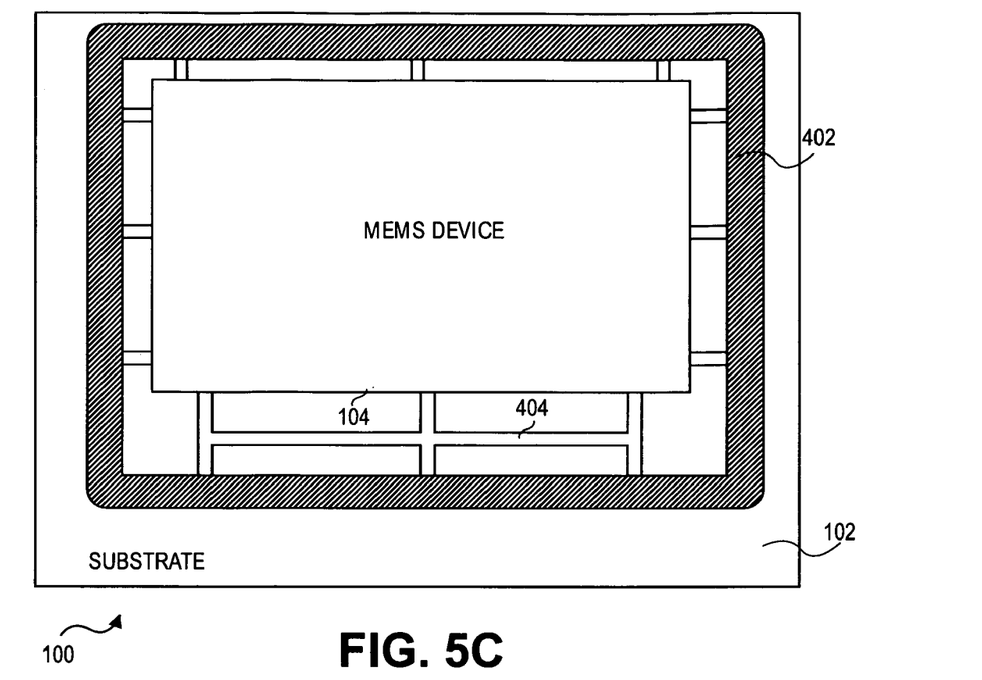
Figure 5D:
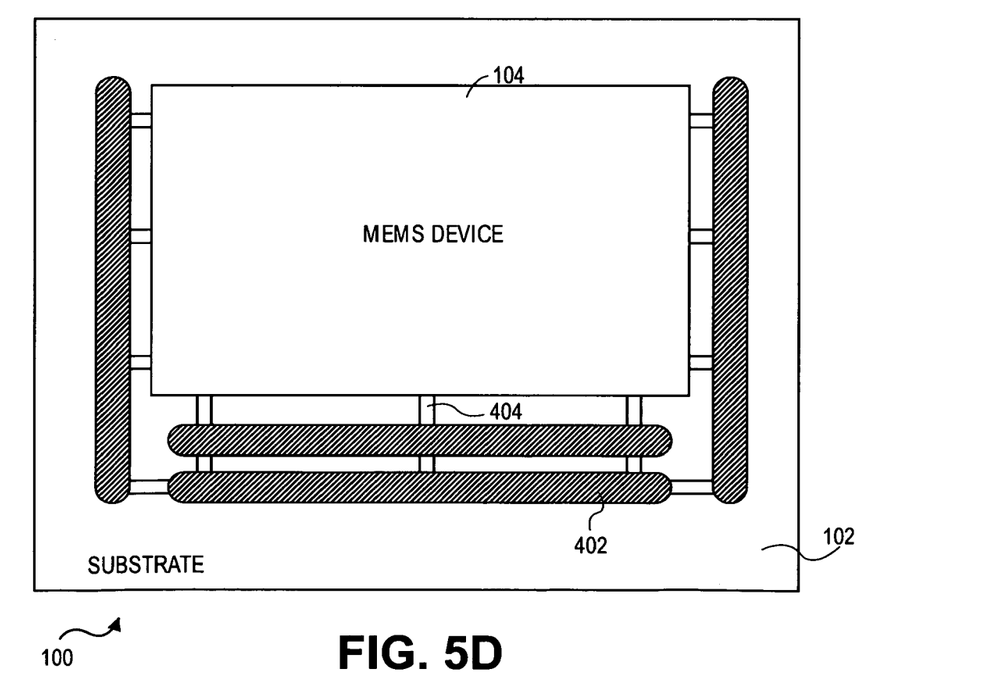

FIG. 4 shows the packaged MEMS device assembly 100 in more detail, according to another embodiment of the invention. The MEMS device assembly 100 of FIG. 4 is specifically a more detailed version of the assembly 100 of FIG. 1A. Thus, the substrate 102 includes the MEMS device 104 disposed therein, and the lid 106 is disposed in direct bonding contact with the substrate 102 within which the MEMS device 104 is disposed.

The MEMS device assembly 100 includes a number of cavities 402A and 402B, collectively referred to as the cavities 402. While there are two such cavities 402 in the example of FIG. 4, there may be more or less of the cavities 402 in other embodiments. The cavities 402 of FIG. 4 may be the same or different cavities as the cavities 202 of FIG. 2 and/or the cavities 302 of FIG. 3. Furthermore, while the cavities 402 are depicted as empty of material in FIG. 4, they may contain a material, such as a desiccant, and so on, as has been described in relation to FIGS. 2 and 3.

The cavities 402 are fluidically connected to the MEMS device 104 via a number of channels 404A and 404B, collectively referred to as the channels 404. While there are two such channels 404 in the example of FIG. 4, there may be more or less of the channels 404 in other embodiments. The channels 404 are depicted as being disposed within the substrate 102 in the example of FIG. 4. However, in another embodiment, the channels 404 may be disposed within the lid 106.

Thus, the channels 404, which may also be referred to as aqueducts insofar as they transfer fluid, ensure that the MEMS device 104 is fluidically connected to the cavities 402. As has been described in relation to FIG. 2, the cavities 402 may be present to increase the internal air volume within the packaged MEMS device assembly 100, to prevent condensation from occurring on the MEMS device 104. The addition of a desiccant or another material within the cavities 402 assists in such condensation prevention.

However, for such increased air volume due to the cavities 402 to be useful, desirably the cavities 402 are fluidically accessible to the MEMS device 104. In the examples of FIGS. 1B and 2, where the lid 106 is mounted on 108, an air channel between the MEMS device 104 and the lid 106 is inherently created, since the MEMS device 104 does not make contact with the lid 106. However, in the examples of FIGS. 1A, 3, and 4, the lid 106 is in direct contact with the MEMS device 104. Therefore, the MEMS device 104 may not have inherent fluidic access to the cavities 402 in FIG. 4. As such, the fabrication of channels 404 within the substrate 102 (as is depicted in FIG. 4), or within the lid 106, ensures that the MEMS device 104 does have such fluidic access to the cavities 402. It is noted that while the MEMS device assembly 100 of FIG. 4 can also be implemented in relation to the assembly of FIG. 1B besides the assembly of FIG. 1A, it is less advantageous in relation to FIG. 1B, where the MEMS device assembly 100 includes an inherent channel between the lid 106 and the substrate 102 as a result of the ring 108.

FIGS. 5A, 5B, 5C, and 5D show cross-sectional top views of the MEMS device assembly 100 in more detail, according to different embodiments of the invention. Particularly, the lid 106 is not depicted in FIGS. 5A, 5B, 5C, and 5D, and instead just the substrate 102 and the MEMS device 104 are. However, the locations of the cavities 402, which may be the same or different as the cavities 202 and 302, within the lid 106 are indicated in FIGS. 5A, 5B, 5C, and 5D. It is noted that in another embodiment, the cavities 402 may instead be located within the substrate 102. The locations of the cavities 402 are indicated in solid black in FIGS. 5A, 5B, 5C, and 5D. By comparison, the channels 404 that fluidically connect the cavities 402 to the MEMS device 104 are indicated in white in FIGS. 5A, 5B, 5C, and 5D.

FIGS. 5A, 5B, 5C, and 5D are presented to show different designs that can be employed to implement the MEMS device assembly 100 in different embodiments of the invention. However, the MEMS device assembly 100 is not limited in implementation to any particular of these designs. Rather, the designs are presented to show different ways in which the cavities 402 may be located, and in which the channels 404 may be located to fluidically connect the cavities 402 to the MEMS device 104, as can be appreciated by those of ordinary skill within the art.

Fabrication Methods

Figure 6:
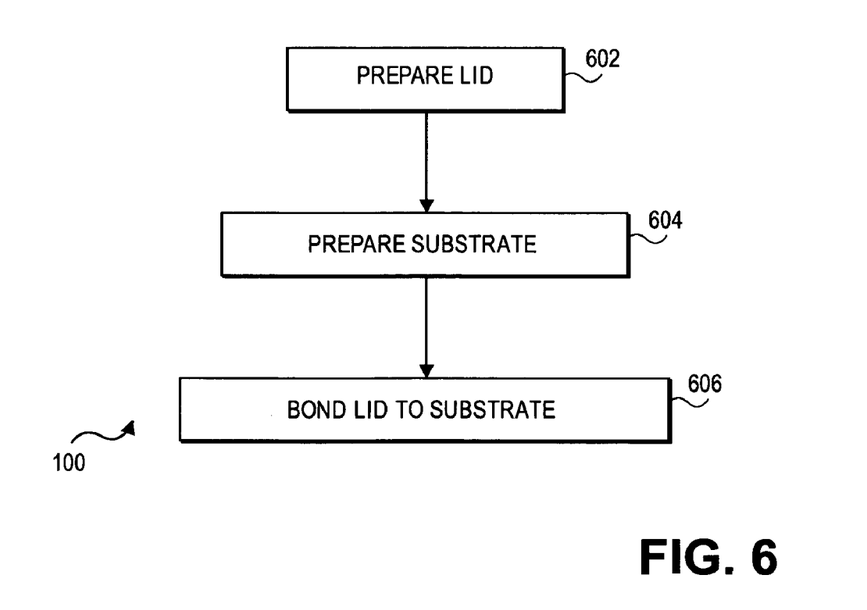
FIG. 6 is a flowchart of a method for fabricating a packaged MEMS device assembly, according to an embodiment of the invention.

FIG. 6 shows a method 600 for fabricating a packaged micro-electromechanical systems (MEMS) device assembly as described in the preceding section of the detailed description, according to an embodiment of the invention. In general, a lid is prepared (602), a substrate is prepared (604), and then the lid and the substrate are bonded together (606), such as via plasma-activated bonding. The lid may be prepared before, after, or at the same time that the substrate is prepared.

Figure 7:
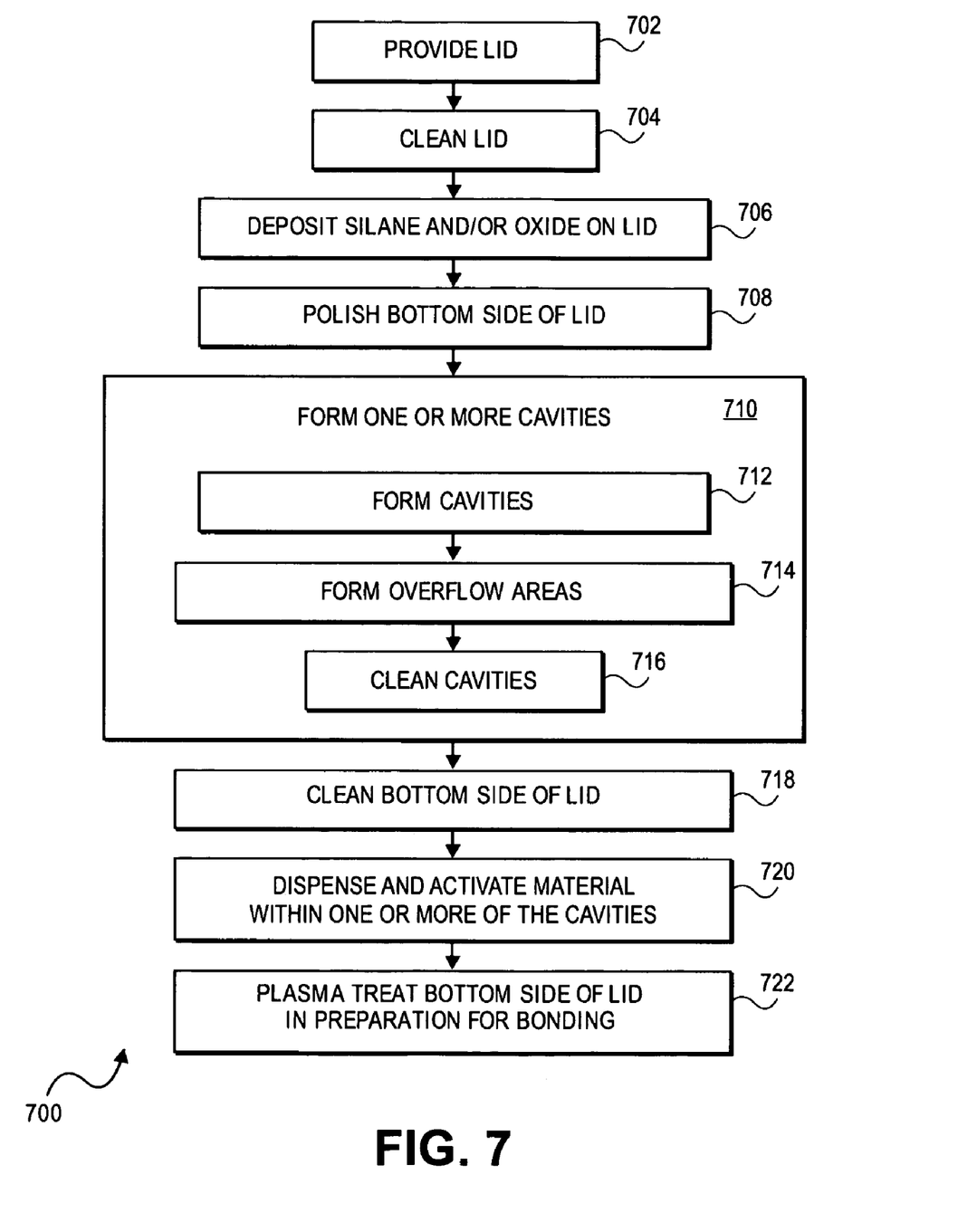
FIG. 7 is a flowchart of a method for preparing the lid of the packaged MEMS device assembly prior to bonding to the substrate of the assembly, according to an embodiment of the invention.

FIG. 7 shows a method 700 that may be employed to prepare the lid in part 602 of the method 600 of FIG. 6, according to an embodiment of the invention. The method 700 delineates the processing that may be performed to the bottom side of the lid in particular, so that this side of the lid can subsequently be bonded to the substrate of the packaged MEMS device assembly. As can be appreciated by those of ordinary skill within the art, however, other processing can and typically will be performed to the top side of the lid, which is beyond the scope of the present disclosure as claimed in the claims below. That is, preparation of the lid vis-à-vis the formation of one or more cavities therein is particularly the focus herein.

A lid is thus provided (702), and cleaned (704), such as by mechanically scrubbing using an appropriate tool available from OnTrak Systems, Inc., of San Jose, Calif. Thereafter, a layer of silane, silicon, and/or oxide is deposited on the bottom side of the lid (706). The bottom side of the lid is then polished (708), such as by chemical mechanical planarization (CMP).

Figure 8A:
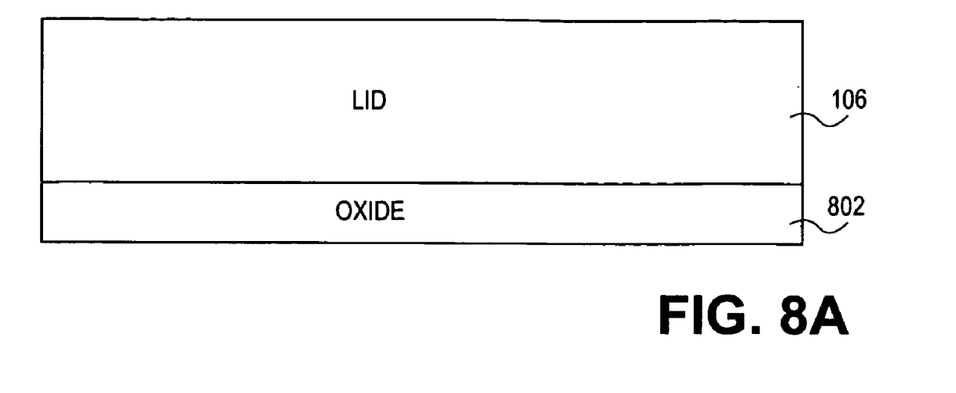
FIGS. 8A, 8B, and 8C are diagrams illustratively depicting performance of the method of FIG. 7, according to an embodiment of the invention.

FIG. 8A shows illustrative performance of parts 702, 704, 706, and 708 of the method 700 of FIG. 7, according to an embodiment of the invention. The lid 106 is provided, and after cleaning, an oxide layer 802 is deposited on the bottom side of the lid 106. In the example of FIG. 8A, a silane layer and/or a silicon layer is not depicted for illustrative convenience. A two-micron layer of oxide may be deposited, for instance, such as of tetraethoxysilane (TEOS), or another type of oxide. The oxide layer 802 is polished, such as by CMP, so that it is atomically smooth. What has been referred to herein as the lid may include the oxide layer 802 (and the silane layer when present), as well as the lid 106 itself.

Referring back to FIG. 7, one or more cavities are formed within the bottom side of the lid (710). The cavities may be the cavities 202 of FIG. 2, the cavities 302 of FIG. 3, and/or the cavities 402 of FIG. 4 that have been described. The cavities may be fabricated by laser machining, mechanical sawing, hot-mold techniques, plasma etching, wet etching, powder blasting, or by another technique (712). Likewise, any overflow areas that are to be fabricated, such as the overflow areas 306 of FIG. 3 that have been described, may be fabricated by laser machining, mechanical sawing, hot-mold techniques, plasma etching, wet etching, powder blasting, or by another technique (714). Thereafter, the cavities and the overflow areas are cleaned (716), such as by using a buffered oxide etch (BOE). The BOE can also relieve mechanical stresses by removing any micro-cracks within the cavities and the overflow areas.

Figure 8B:
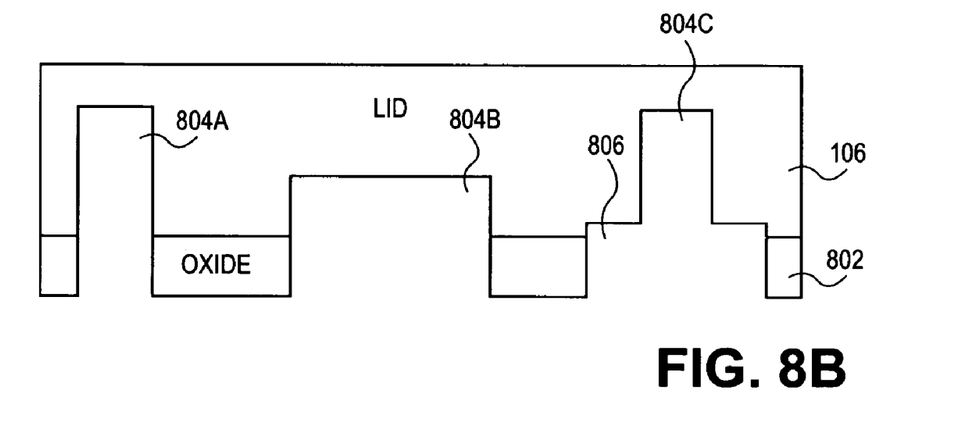

FIG. 8B shows illustrative performance of parts 712, 714, and 716 of the method 700 of FIG. 7, according to an embodiment of the invention. Cavities 804A, 804B, and 804C, collectively referred to as the cavities 804, are fabricated through the oxide layer 802 and into the lid 106. The cavities 804A and 804C are in particular narrower but deeper than the cavity 804B, which is wider but shallower. The cavities 804A and 804C therefore may be fabricated by using mechanical sawing, which more easily constructs narrow and deep cavities, and the cavity 804B may be fabricated by using laser machining, such as by using a laser having a 355 nanometer (nm) or a 266 (nm) wavelength, which more easily constructs wide and shallow cavities.

The cavity 804C has a corresponding overflow area 806. The overflow area 806 may be formed in the same manner that the cavity 804C is formed, or by a different manner. For instance, where the cavity 804C is fabricated using mechanical sawing, the mechanical saw may be pulled back and shifted to the left and then to the right to construct the overflow area 806. It is noted that the overflow area 806 extends into the lid 106 itself, and thus is deeper than overflow areas within the prior art, which only extend through the oxide layer 802 and not through to the lid 106. Extending the overflow area 806 into the lid 806 provides for greater overflow capability. Once the cavities 804 and the overflow area 806 have been formed, cleaning is performed.

Referring back to FIG. 7, the entire bottom side of the lid may be cleaned (718), and material deposited within one or more of the cavities and then activated (720). As has been described, such material may include desiccants, other types of getter materials, lubricants, and other types of materials. Thereafter, the bottom side of the lid is plasma treated in preparation for bonding with the substrate to form the completely packaged MEMS device assembly (722).

Figure 8C:
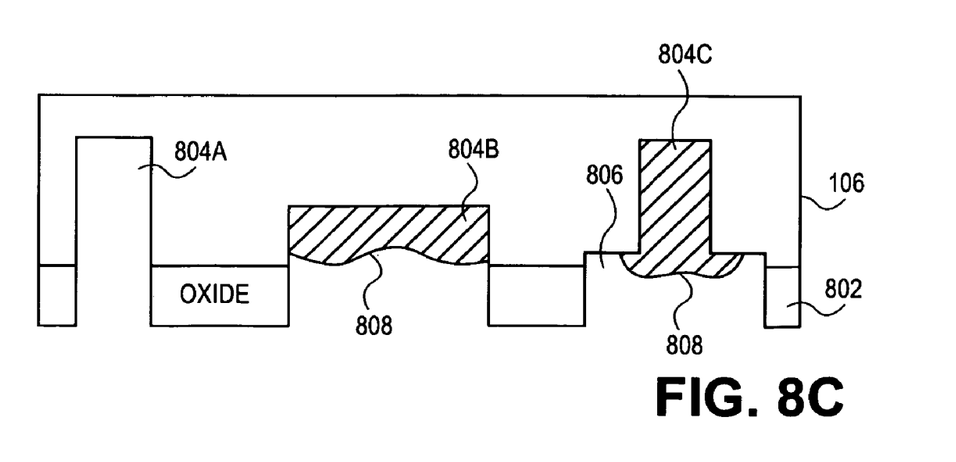

FIG. 8C shows illustrative performance of parts 718, 720, and 722 of the method 700 of FIG. 7, according to an embodiment of the invention. The entire bottom side of the lid 106 (that is, the oxide layer 802) is cleaned. Thereafter, material 808 is deposited in the cavities 804B and 804C, while the cavity 804A remains empty. The same material may be deposited in each of the cavities 804B and 804C, or a different material may be deposited in each of these cavities. It is noted that the material 808 deposited in the cavity 804C has overflowed past the opening of the cavity 804C, but does not spill onto the bottom side of the lid 106 (that is, the oxide layer 802), since the excess material 808 is instead contained or caught by the overflow area 806. Finally, the bottom side of the lid 106 (that is, the oxide layer 802) is plasma treated in preparation for bonding.

Figure 9:
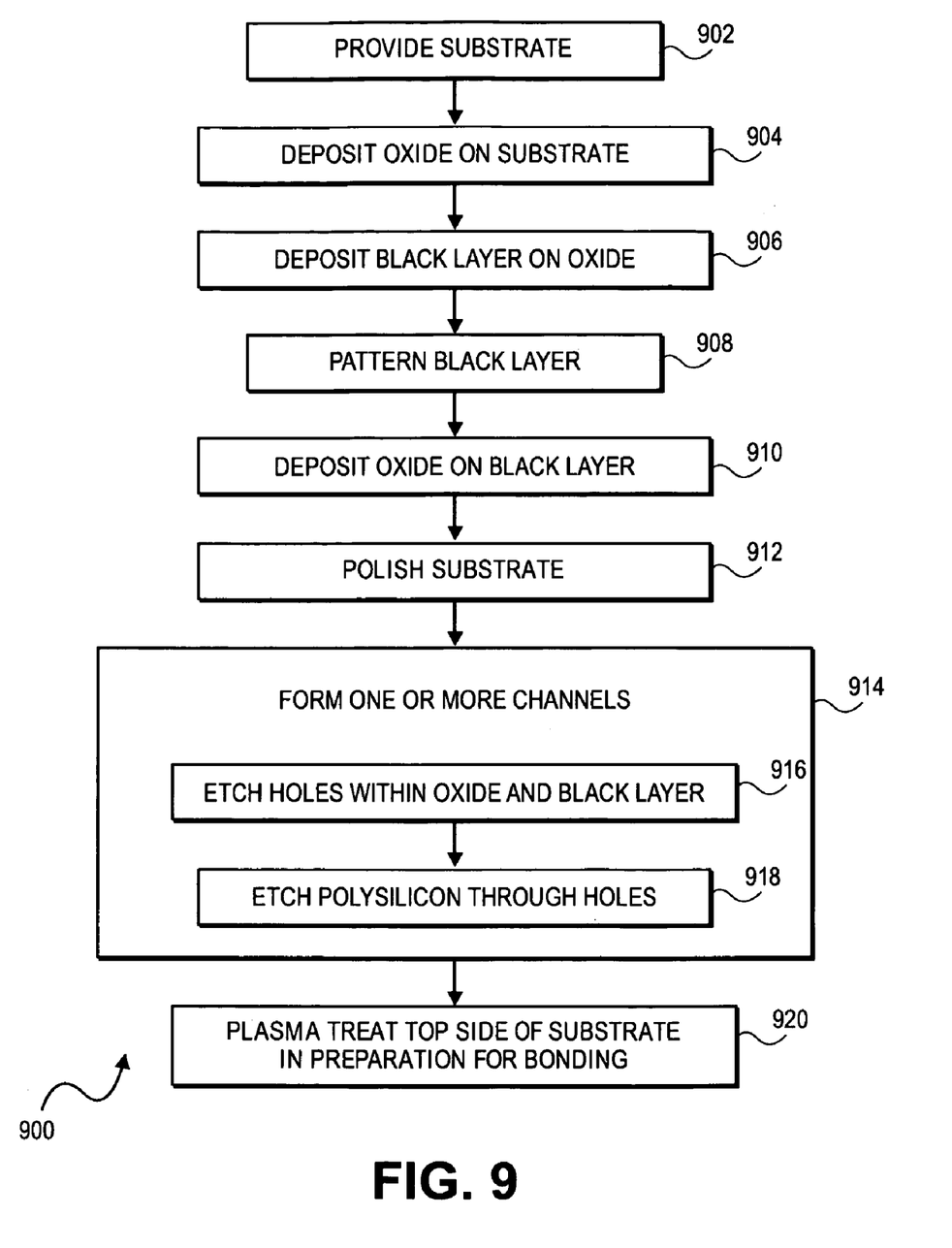
FIG. 9 is a flowchart of a method for preparing the substrate of the packaged MEMS device assembly prior to bonding to the lid of the assembly, according to an embodiment of the invention.

FIG. 9 shows a method 900 that may be employed to prepare the substrate in part 604 of the method 600 of FIG. 6, according to an embodiment of the invention. The method 600 delineates the processing that may be performed to the top side of the substrate in particular, so that this side of the substrate can subsequently be bonded to the lid of the packaged MEMS device assembly. As can be appreciated by those of ordinary skill within the art, however, other processing can and typically will be performed to the substrate, such as to dispose and electrically connect the MEMS device within and to the substrate, which is beyond the scope of the present disclosure as claimed in the claims below. That is, preparation of the substrate vis-à-vis the formation of one or more channels therein is particularly the focus herein.

A substrate is thus provided (902) that has a MEMS device already deposited therein. A layer of oxide is deposited on the top side of the substrate (904). An optically black layer is deposited over the layer of oxide (906), and patterned to let visible light reach the MEMS device (908). Thereafter, another layer of oxide is deposited on the black layer (910), and the substrate is polished (912), such as by CMP.

Figure 10A:
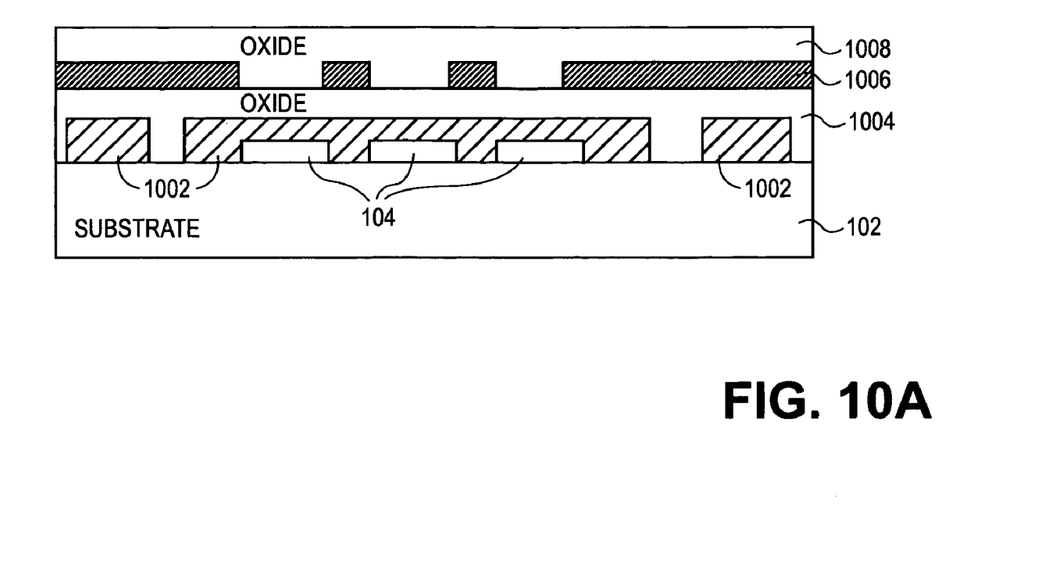
FIGS. 10A and 10B are diagrams illustratively depicting performance of the method of FIG. 9, according to an embodiment of the invention.

FIG. 10A shows illustrative performance of parts 902, 904, 906, 908, 910, and 912 of the method 900 of FIG. 9, according to an embodiment of the invention. The substrate 102 is provided, within or on which the MEMS device 104 is disposed. The MEMS device 104 is depicted in FIG. 10A in more detail than as depicted in the earlier described figures. In particular, the MEMS device 104 is depicted as being encased within a central layer of polysilicon 1002, which can also be referred to as a silicon layer. There are smaller islands of polysilicon 1002 to the left and the right of the central part that encases the MEMS device 104, which serve to provide an even top side or surface for the substrate 102. What has been referred to herein as the substrate can encompass the polysilicon 1002 in addition to the substrate 102 itself.

A first layer of oxide 1004 is deposited over the MEMS device 104 and the substrate 102, and which may be TEOS or another type of oxide. An optically black layer 1006 is deposited over this oxide 1004, and patterned to optically expose the MEMS device 104 as shown in FIG. 10A. The black layer 1006 may be a high-index/high-dispersion (H ID) glass layer. Patterning may be achieved by photolithography, etching, or another technique. A second layer of oxide 1008, such as TEOS or another type of oxide, is then deposited over the black layer 1006, and the substrate 102 is polished. What has been referred to herein as the substrate can encompass the oxide 1004 and 1008 in addition to the substrate 102 itself.

Referring back to FIG. 9, one or more channels, or aqueducts, are then formed within the substrate 102 (914). Formation of the channels may be achieved by etching holes within the oxide that has been deposited (916), and etching tubes within the polysilicon of the substrate (918). Thereafter, the top side of the substrate is plasma treated in preparation for bonding with the lid to form the completely packaged MEMS device assembly (920).

Figure 10B:
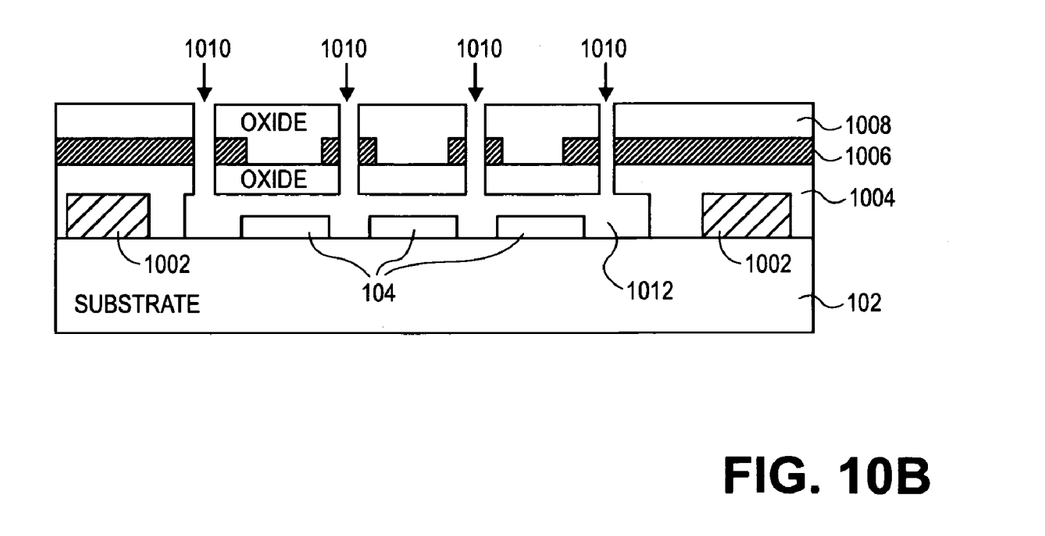

FIG. 10B shows illustrative performance of parts 914, 916, 918, and 920 of the method 900 of FIG. 9, according to an embodiment of the invention. Holes 1010 are etched through the oxide 1008 and 1004, as well as through the black layer 1006. Etching may be achieved by using plasma and/or another type of etching in conjunction with appropriate photolithography or other patterning techniques to select or isolate the locations where the holes 1010 are fabricated.

Thereafter, a tube 1012 is formed within the polysilicon 1002 surrounding the MEMS device 104, and which may result in complete removal of the polysilicon 1002 surrounding the MEMS device 104, as is depicted in FIG. 10B. The trench 1012 can be formed by releasing an etchant that is selective to the polysilicon 1002 within the holes 1010. Thus, the holes 1010 enable the etchant to reach the polysilicon 1002, and the polysilicon 1002 to be removed. Examples of such an etchant include xenon difluoride ($XeF_2$), tetra methyl ammonium hydroxide (TMAH), and sulfur hexafluoride ($SF_6$) plasma etchant, among others. The channels or aqueducts thus encompass both the holes 1010 and the tube 1012. The top side of the substrate 102 (that is, the oxide layer 1008) is then plasma treated in preparation for bonding.

In the particular example of FIG. 10B, the material that is sacrificed to yield the tube 1012 is polysilicon, and the material that has holes fabricated therethrough to reach the sacrificial material is oxide. That is, the polysilicon is a sacrificial material, and the oxide is a non-sacrificial material. In another embodiment, however, the sacrificial material may be oxide, and the non-sacrificial material within which holes are fabricated to reach the sacrificial material may be polysilicon. In such an embodiment, BOE or another type of etchant may be employed to remove the sacrificial oxide. It is noted that the terminology sacrificial refers to material that is removed more than it remains, and that the terminology non-sacrificial refers to material that remains more than it is removed.

We claim:

1. A packaged micro-electromechanical systems (MEMS) device assembly comprising:
    a MEMS device;
    a substrate within which the MEMS device is disposed;
    a lid disposed over the substrate; and,
    one or more of:
        one or more first cavities within the lid having a predetermined volume satisfying packaging specifications for the packaged MEMS device assembly;
        one or more second cavities within the lid and one or more corresponding overflow areas within the lid, each second cavity containing a material and each corresponding overflow area adapted to catch overflow of the material, where each second cavity is overlapped by a corresponding overflow area having a width greater than a width of the second cavity and a depth shallower than a depth of the second cavity; and,
        one or more third cavities within the lid and one or more channels within at least the substrate to fluidically connect the MEMS device to the third cavities, where the channels are narrower than the third cavities.

2. The packaged MEMS device assembly of claim 1, wherein one or more of the second cavities and the third cavities are a same cavity.

3. The packaged MEMS device assembly of claim 1, wherein a hermetic seal is defined at the interface between the substrate and the lid.

4. The packaged MEMS device assembly of claim 1, comprising at least the first cavities, such that within each of one or more of the first cavities a material is disposed therein, the material comprising one or more of: a desiccant material, a getter material, and a lubricant.

5. The packaged MEMS device assembly of claim 1, wherein a top of the MEMS device is flush with a top of the substrate within which the MEMS device is disposed.

6. The packaged MEMS device assembly of claim 1, comprising at least the second cavities and the corresponding overflow areas, each second cavity having desiccant disposed therein and a corresponding overflow area adapted to catch overflow of the desiccant.

7. The packaged MEMS device assembly of claim 1, comprising at least the third cavities within the lid and the channels within the substrate.

8. The packaged MEMS device assembly of claim 7, wherein the substrate comprises a first layer and one or more second layers, and the channels each comprise a plurality of holes within the second layers and one or more tubes within the first layer underneath the holes within the second layers.

9. The packaged MEMS device assembly of claim 1, wherein the lid is a glass lid in bonding contact with the substrate.

10. The packaged MEMS device assembly of claim 1, wherein the lid is at least substantially transparent, and the MEMS device comprises a plurality of display elements, such that the packaged MEMS device assembly is part of a display device.

11. The packaged MEMS device assembly of claim 1, wherein the MEMS device is disposed within the substrate such that the substrate comes into direct contact with the MEMS device on a bottom, a left side, and a right side of the MEMS device.

* * * * *